(12) United States Patent
Yen

(10) Patent No.: US 8,098,075 B2
(45) Date of Patent: Jan. 17, 2012

(54) TESTING METHOD FOR ELECTRONIC APPARATUS

(75) Inventor: Tao-Cheng Yen, Sanchong (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 13 days.

(21) Appl. No.: 12/625,865

(22) Filed: Nov. 25, 2009

(65) Prior Publication Data

US 2011/0012611 A1   Jan. 20, 2011

(30) Foreign Application Priority Data

Jul. 16, 2009   (CN) .......................... 2009 1 0041275

(51) Int. Cl.
*G01R 31/14* (2006.01)
*G01R 31/00* (2006.01)

(52) U.S. Cl. ........... 324/750.3; 324/754.07; 324/764.01; 324/537; 324/511; 713/340

(58) Field of Classification Search .................. 324/537, 324/750.3–754.07; 713/340
See application file for complete search history.

(56) References Cited

U.S. PATENT DOCUMENTS

| 4,520,416 A * | 5/1985 | Karash ............................. 361/11 |
| 6,367,024 B1 * | 4/2002 | Ezell ............................. 713/340 |
| 7,242,291 B2 * | 7/2007 | Nicolls et al. ................. 340/515 |
| 7,539,880 B2 * | 5/2009 | Mentzer et al. ............... 713/300 |
| 2007/0007969 A1* | 1/2007 | Dai et al. ....................... 324/601 |
| 2008/0036467 A1* | 2/2008 | Butler .......................... 324/511 |

* cited by examiner

*Primary Examiner* — Huy Q Phan
*Assistant Examiner* — Emily Chan
(74) *Attorney, Agent, or Firm* — Li & Cai Intellectual Property (USA) Office

(57) ABSTRACT

An electronic apparatus includes a first power contact, a second power contact, and a control unit. The first power contact is electrically connected with an anode of a power supply source, and the second power contact is electrically connected with a cathode of the power supply source. The control unit electrically connects the first power contact and the second power contact for forming a signal transmission path and receiving the power generated by the power supply source. When the control unit is operated in a testing mode, the control unit operates in a working mode or a sleeping mode according to an instruction of a default instruction set for changing a current waveform signal transmitted over the signal transmission path, so as to achieve the purpose of providing a convenient and high-efficiency testing.

6 Claims, 3 Drawing Sheets

| Operation Field of Functional element | Instruction Field | Logical Data Field |
|---|---|---|
| Transmission Frequency | ⎍⎍⎍⎍ | 10101010 |
| Transmission Identification code | ⎍⎍⎍ | 01110 |
| Left key function | ⎍⎍ | 10010 |
| Right key function | ⎍⎍ | 10011 |
| ⋮ | ⋮ | ⋮ |

TESTING METHOD FOR ELECTRONIC APPARATUS

BACKGROUND OF THE INVENTION

1. Field of the Invention

The present invention relates to an electronic apparatus and a testing method of the electronic apparatus, in particular, to an electronic apparatus that applies a current waveform signal transmitted by a power cable of the electronic apparatus as a testing signal and a testing method thereof.

2. Description of Related Art

To assure the quality and stability of an electronic apparatus, testing is a necessary step in the production process of the electronic apparatus. Before electronic apparatuses are distributed to consumers from a factory, manufacturers have to double check any functional elements with certain specific functions of the electronic apparatuses (such as a wireless communication module, a press key, a roller, and a touch pad, etc) can be operated properly. In other words, when users press or operate functional elements, manufacturers have to assure that a control unit of the electronic apparatus can transmit digital signals to a host via wireless or cable transmissions correctly to maintain good quality and stability of the electronic apparatus.

To test an electronic apparatus effectively, present designs and practices generally reserve a plurality of testing pins on a printed circuit board of the control unit associated with the electronic apparatus so as to provide testing data to a testing device in a testing mode, and to verify whether or not a correct digital signal is issued when a functional element of the electronic apparatus is pressed or operated.

For the consideration of aesthetic appearance, the testing pins of the printed circuit board are hidden in a battery slot of the electronic apparatus. If a test is completed or no test is performed, users simply use a lid of the battery slot to cover a battery as well as the testing pins. For an electronic apparatus requiring no battery, the testing pins are installed at testing holes formed on a housing, but the installed testing pin may destroy the overall aesthetic appearance. No matter what, the testing pins are not necessary and have no substantial use for users. Furthermore, the testing pins not only occupy space, but also destroy the aesthetic appearance.

In view of the aforementioned shortcomings, the inventor of the present invention designed and developed an electronic apparatus and designed a testing method of the electronic apparatus in accordance with the present invention to overcome the shortcomings of the prior art.

SUMMARY OF THE INVENTION

Therefore, A primary objective of the present invention is to provide an electronic apparatus and a testing method of the electronic apparatus, wherein a present existing power cable is used for inputting a voltage source of an external power supply source, such that if a user presses or operates a functional element in a testing mode, the control unit will rather affect an initial current waveform of the external power supply source through intermittently operating at on or off state instead of issuing a corresponding operation signal to a host, for the testing of each functional element. The existing power cable of the electronic apparatus is also used as a path of transmitting testing signals to avoid aforementioned problems caused by the additionally installed testing pins according to the prior art.

To overcome the aforementioned problems, the present invention provides a solution and an electronic apparatus comprising: a first power contact, a second power contact and a control unit, wherein the first power contact is electrically coupled to an anode of a power supply source, and the second power contact is electrically coupled to a cathode of the power supply source, and the control unit is electrically coupled to the first power contact and the second power contact to form a signal transmission path and receives electric power supplied by the power supply source. When the control unit is switched in a testing mode, the control unit is turned on or off according to an instruction of a default instruction set for changing a current waveform signal transmitted by the signal transmission path.

To overcome the aforementioned problems, the present invention provides a testing method of the electronic apparatus, and the method comprises the steps of: providing a power supply source electrically coupled to electronic apparatus for supplying electric power to the electronic apparatus, such that when the electronic apparatus is operated in a testing mode, the electronic apparatus is turned on or off according to an instruction of a default instruction set. Therefore, providing a current detection device connected in series between the power supply source and the electronic apparatus for detecting an alteration of current waveform when the electronic apparatus is turned on that the electronic apparatus consumes current from the power supply source, or turned off that the electronic apparatus does not consume current from the power supply source.

Therefore, the electronic apparatus of the present invention not only transmits electric power of a power supply source through a power cable, but also transmits testing signals to a testing instrument directly through the power cable in a testing mode. The electronic apparatus is no longer needed to reserve any testing points, to increase the area of a printed circuit board, to change the circuit layout or even to destroy the appearance of the device, so as to save time in mass production and enhance the efficiency of testing.

The characteristics and technical contents of the present invention will become apparent by the detailed description of the following preferred embodiments together with the illustration of related drawings. It is noteworthy to point out that the drawings are provided for the reference and illustration purposes only, but not intended to limit the scope of the invention.

DETAILED DESCRIPTION OF THE PREFERRED EMBODIMENTS

The present invention comes with a control unit of an electronic apparatus (such as a wireless mouse, a wireless keyboard, a wireless remote controller, etc), so that if the aforementioned functional element is pressed or operated in a testing mode, the control unit will not allow any signals corresponding to operations to be transmitted to a host, but affect an current waveform of an external power supply source through operating in different modes, thus to detect an alteration of current waveform can be used for testing each functional element. In other words, various current waveform variations produced by various functional elements are used as testing signals of various functional elements.

The present invention applies the alteration of current waveform transmitted from the power cable of the electronic apparatus as the testing signal directly, instead of applying any driving devices to load testing data to the power cable to achieve the so-called power cable communication (PLC).

Figure 1:
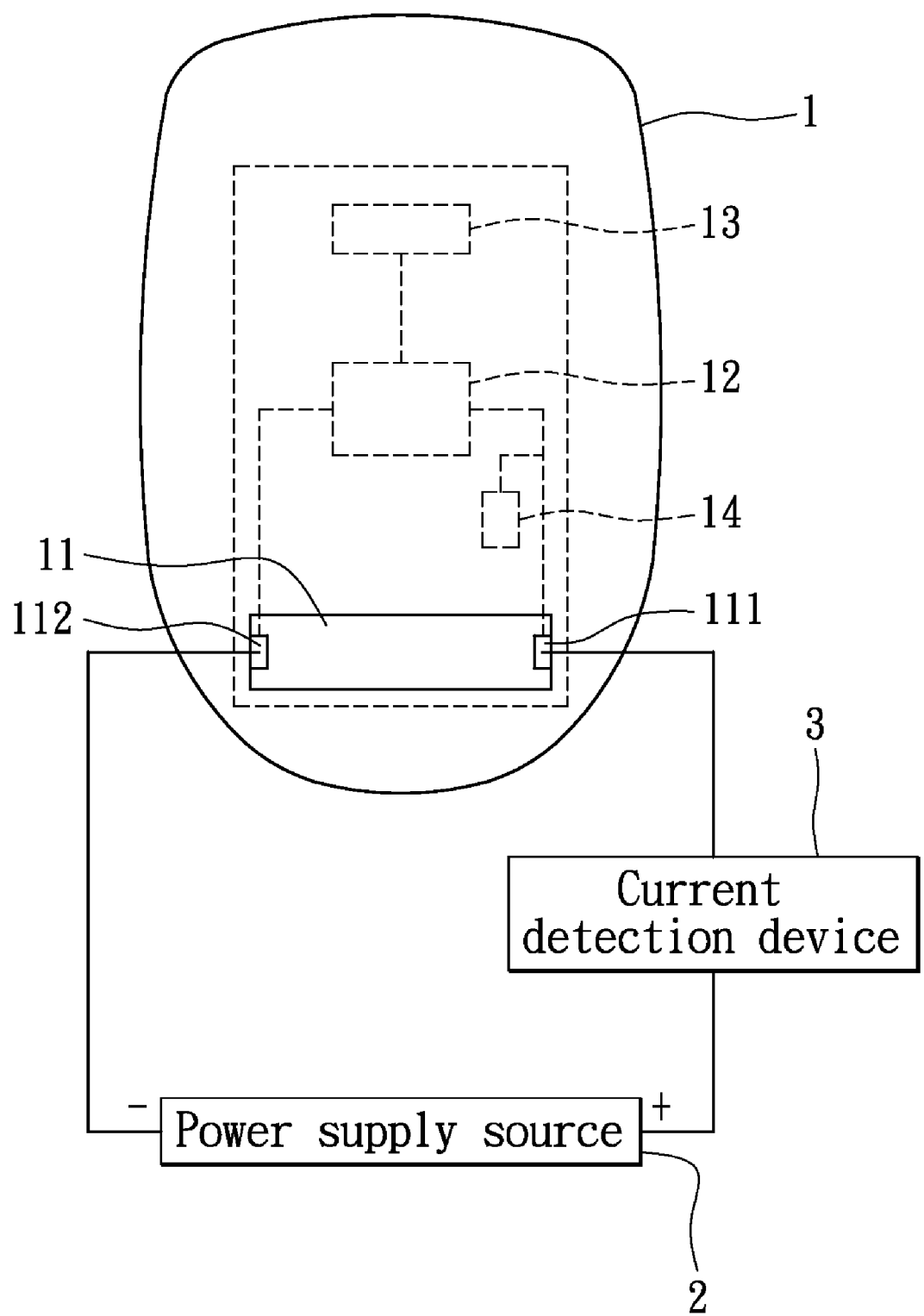
FIG. 1 is a schematic view of a wireless apparatus in accordance with a preferred embodiment of the present invention.

With reference to FIG. 1 for a schematic view of a wireless apparatus in accordance with a preferred embodiment of the present invention, the wireless apparatus 1 is a wireless mouse, comprising: a battery slot 11, a control unit 12 and a power transmission module 13. The power transmission module 13 is a selective device. The battery slot 11 further includes a first power contact 111 and a second power contact 112, and the first power contact 111 and the second power contact 112 are elastic metal plates disposed at both ends of the battery slot 11 for electrically connecting an anode (+) and a cathode (−) of a power supply source 2 respectively. To perform a test for the wireless apparatus 1, it is necessary to connect the power supply source 2 of the wireless apparatus 1 in parallel, and also connect a current detection device 3 in series between the wireless apparatus 1 and the power supply source 2.

To perform a test for the inputted external power supply source, the power supply source 2 is connected in parallel with an existing power transmission path (such as a power cable, or the first power contact 111 and the second power contact 112 of the battery) of the wireless apparatus 1, so that the control unit 12 can receive electric power supplied by the power supply source 2 through the existing power transmission path.

Since the current of the power supply source 2 is passed through the control unit 12, an initial current waveform of the external power supply source 2 will be affected. Whenever the control unit 12 is operated in a working mode that consumes current or a sleeping mode that does not consume current, the detected current waveform variation is used as a testing signal for each functional element. With the aforementioned basis, a testing system defines a working mode of the control unit 12 as 0 that consumes current, and a sleeping mode as 1 that does not consumes current, similarly to provide a digital signal used for a conventional testing.

To detect the aforementioned alteration of current, the current detection device 3 is connected in series between the wireless apparatus 1 and the power supply source 2 for detecting a current waveform signal generated by the wireless apparatus 1 as a digital testing signal equivalent to 0 or 1. Since the current detection device 3 is connected in series for detecting the current waveform, the invention is not limited to the serial connection between the power supply source 2 and the first power contact 111 of the wireless apparatus 1 as shown in FIG. 1. In fact, the current detection device 3 can also be connected in series between the power supply source 2 and the second power contact 112 of the wireless apparatus 1.

To test various functional elements, a default instruction set (not shown in the figure) designed by a firmware program provides various alterations of current waveform (equivalent to a digital testing signal of 0 or 1) associated with different functional elements, such that when the control unit 12 generates various testing signals, the control unit will be operated at on or off state (which is an intermittent operation of the working mode and the sleeping mode). More specifically, the foregoing instruction set records representative signals under the operation of a plurality of different functional elements of the wireless apparatus 1 as a testing basis for each functional operation of the wireless apparatus 1. The operation of the aforementioned functional element comprises an initialization (such as an initialization of a communication frequency and an identification code required for starting the operation of the wireless apparatus 1) of the wireless apparatus 1, and different functions (including but not limited to the functions of each press key and a roller of a wireless mouse) provided by the wireless apparatus 1 and operated by the user.

If the control unit 12 is switched and operated in a testing mode, the user simply presses or operates the functional element (such as clicking the right button of the mouse), such that the control unit 12 can turn on and off intermittently according to an instruction of an instruction set to alternate a current waveform signal transmitted from the signal transmission path, and the current waveform will have a different waveform alteration according to the operations of different functional elements. The control unit 12 is accordance with a present operation (such as an initialization or a function operated by users) of a functional element of the wireless apparatus 1 to inquire the instruction set to obtain an instruction corresponding to the present operation of the functional element, so as to turn on or off the control unit 12 according to the obtained instruction.

For those ordinarily skilled in the art, the way of switching the testing mode and an operating mode can be set and defined by a pin (not shown in the figure) of the control unit 12, such that the control unit 12 can determine whether or not the wireless apparatus 1 is operated in the testing mode or the operating mode according to a voltage level of the pin.

It is noteworthy to point out that the design of the wireless apparatus 1 further includes a capacitor 14 connected in parallel with the signal transmission path for adjusting a clock speed of the current waveform signal by means of the capacitance of the capacitor 14. More specifically, the greater the capacitance, the greater is the cycle time of the current waveform signal. As a result, a more accurate determination of the current waveform signal detected by the current detection device 3 can be achieved, but a longer time is required.

In the aforementioned structure, the wireless apparatus 1 operated in the testing mode can be used for detecting a testing signal which is a current waveform signal transmitted through the signal transmission path (or the power cable).

With reference to FIG. 1 again, the power transmission module 13 of the wireless apparatus 1 is electrically coupled to the control unit 12, and provided for connecting a dongle (not shown in the figure) of a host system (not shown in the figure) via a wireless connection. If the control unit 12 is switched to the operating mode, the control unit 12 will transmit an instruction from the instruction set to the dongle through the power transmission module 13, such that the host system can receive an instruction outputted by the wireless apparatus 1 through the dongle to perform a corresponding action. Similarly, the control unit 12 also applies a present operation (such as an initialization or a function operated by users) of a functional element of the wireless apparatus 1 to inquire an instruction set to obtain an instruction corresponding to the present operation of the functional element, so as to transmit the obtained instruction to the dongle. For simplicity, the power transmission module 13 of this preferred embodiment is designed and connected externally to the control unit 12, but the power transmission module 13 can be integrated into the control unit 12 directly to reduce the overall occupied area.

As to the aforementioned initialization of the wireless apparatus 1, the wireless apparatus 1 and the dongle start acknowledging the frequency and the identification code for each other, when a user triggers an online connection (such as pressing an online key of the wireless apparatus 1).

Figure 2:
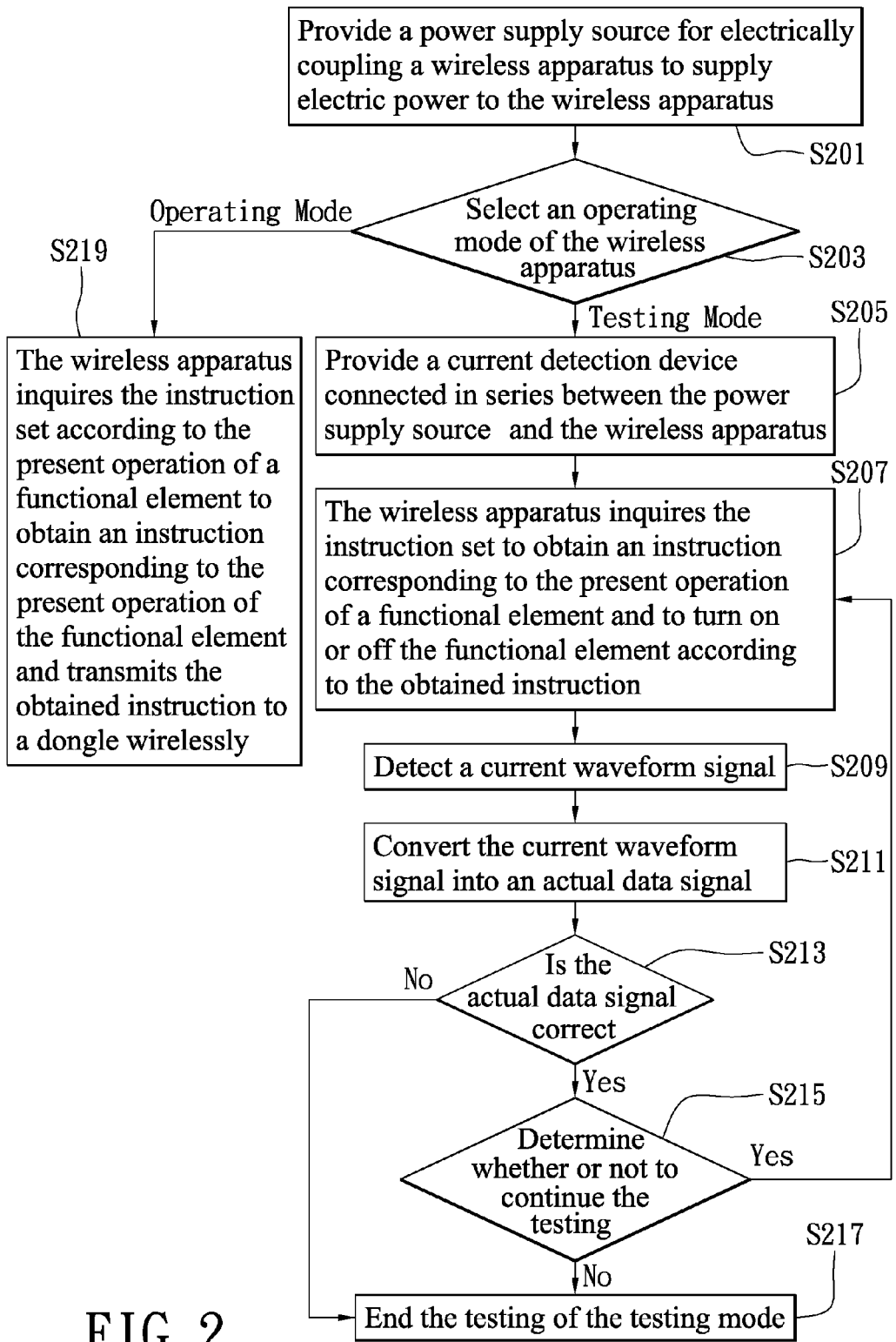
FIG. 2 is a flow chart of a testing method of a wireless apparatus in accordance with a preferred embodiment of the present invention.

With reference to FIG. 2 for a flowchart of a testing method of a wireless apparatus in accordance with a preferred embodiment of the present invention, this embodiment is provided for further describing the actual testing method and the operating mode of the wireless apparatus 1 based on the structure of the wireless apparatus 1 as shown in FIG. 1. In FIG. 2, the testing method of the wireless apparatus 1 comprises the following steps: In Step (S201), a power supply source 2 is provided for electrically coupling the wireless apparatus 1 for supplying electric power to the wireless apparatus 1. In Step (S203), an operating mode of the wireless apparatus 1 is switched selectively according to a user's requirement.

If a testing mode is selected in Step (S203), it shows that a user wants to perform a test of the wireless apparatus 1 through an externally connected instrument. As to the design, if the wireless apparatus 1 is switched to the testing mode, the wireless apparatus 1 will be controlled to turn on and off intermittently according to the instruction of the default instruction set.

In Step (S205), a current detection device 3 is connected in series between the power supply source 2 and the wireless apparatus 1. In Step (S207), if a user operates a function (such as triggering an online requirement to perform an initialization, or pressing a press key to perform a corresponding function, etc) of the wireless apparatus 1, the wireless apparatus 1 will inquire the instruction set to obtain an instruction corresponding to the present operation of the functional element, and turn on and off intermittently according to the obtained instruction. In Step (S209), the current detection device 3 can detect a current waveform, since the on/off operation of the wireless apparatus 1 will affect the alteration of current waveform.

Therefore, users can determine whether or not the detected current waveform matches the original predetermined instruction for operating the functional element to attain the intended testing effect. Furthermore, to avoid human errors caused by a wrong judgment, this preferred embodiment further comprises the following steps after Step (S209) takes place. In Step (S211), the current waveform signal is converted into an actual data signal (or a logical data). In Step (S213), the current detection device 3 verifies whether or not the actual data signal is correct according to a conversion table of testing data, wherein the conversion table of testing data is designed corresponding to the instruction set, and provided for recording the operation of each functional element of the wireless apparatus 1 and the content of logical data associated with the operation instruction of these functional elements, such that the current detection device 3 can compare the actual data signal with the content of logical data in the conversion table of the testing data according to the operation of the current functional element to determine whether or not the actual data signal is correct.

If the determination result of Step (S213) is affirmative, then it shows that the operation testing of the current functional element is correct. In (S215), a decision is made to determine whether or not to continue the testing. If the determination result of Step (S215) is affirmative, then it shows that the user wants to further operate another function of the wireless apparatus 1 for the testing, and the Step (S207) and the steps thereafter are repeated. On the other hand, if the determination result of Step (S213) is negative, it shows that the testing of the present operation of the functional element is incorrect, or if the determination of the Step (S215) is negative, it shows that the testing has been completed, and the user does not want to perform the testing for other functions. In (S217), the testing of the testing mode has ended.

If an operating mode is selected in Step (S203), it shows that the user wants to test the actual machine operation. In other words, the wireless apparatus 1 is connected to a dongle of a host system for testing the actual machine operation. If the wireless apparatus 1 is switched to the operating mode, the wireless apparatus 1 will transmit an instruction of the instruction set to the dongle. In Step (S219), if a user operates a function of the wireless apparatus 1, the wireless apparatus 1 will inquire the instruction set according to the present operation of the functional element to obtain the instruction corresponding to the present operation of the functional element, and, the obtained instruction is transmitted to the dongle directly, such that the host system can perform the related action. In this operating mode, users can verify each function of the wireless apparatus 1 by operating in practice.

Figures 3, 4:
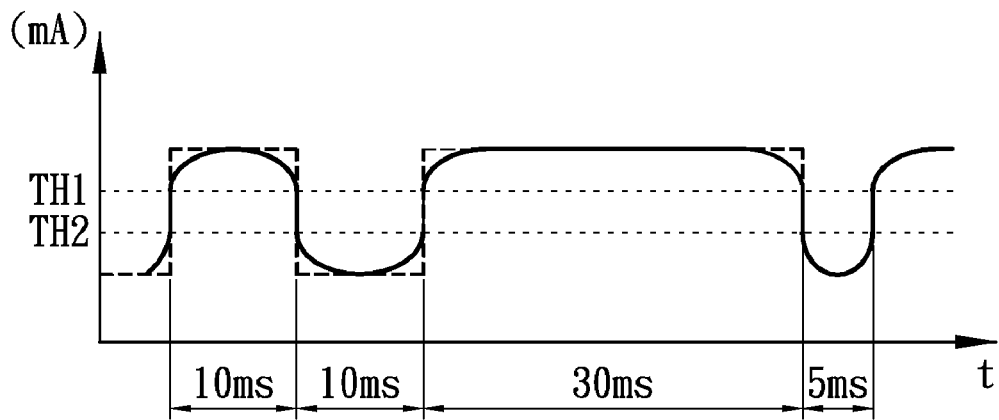
FIG. 3 is a conversion table between an instruction set and a testing data in accordance with a preferred embodiment of the present invention.
FIG. 4 is a waveform timing chart of a current waveform signal according to the present invention.

With reference to FIG. 3 for a conversion table between an instruction set and a testing data in accordance with a preferred embodiment of the present invention, this embodiment is provided for describing the contents of the instruction set and the testing data recorded in the conversion table.

As long as the control unit 12 can operate in a working mode that consumes current or a sleeping mode that does not consume current, these modes will affect an initial current waveform of the external power supply source 2 and the current detection device 3 installed in series between the wireless apparatus 1 and the power supply source 2 is adopted. When the current detection device 3 detects an alteration of current waveform passing thru the current transmission path, the detection is divided into two detecting methods, respectively detecting a current value on the current transmission path within a predetermined time interval (such as 10 ms) and detecting the current value on the current transmission path anytime. If the current detection device 3 detects a current value within a predetermined time interval, and the detected value is less than or greater than a certain current value, then the first logical state or second logical state (such as 0 or 1) will be determined, respectively. If the current detection device 3 detects a current value anytime, and the detected current value is less than or greater than a certain current value, then 0 or 1 will be determined.

Since the instruction set records the operation of each functional element of the wireless apparatus 1 and the instruction corresponding to the operation of these functional elements, therefore the instruction set has an operation field of functional element C1 and an instruction field C2 as shown in FIG. 3. A wireless mouse is used for the illustration as follows. The operation field of functional element C1 includes a transmission frequency of a wireless communication module, a transmission identification code, a mouse left-key function, a mouse right-key function, etc., and the instruction field C2 corresponds to a predetermined instruction corresponding to an operation of each functional element. For example, a logical data field C3 such as a transmission frequency with continuous intervals of 0 and 1 can be determined to be equal to 0 or 1, if the current detection device 3 detects a current value anytime and the detected current value is less than or greater than a certain current value; the transmission identification code and the left-key function can be a continuous logical data field C3 with 0 or 1, and the 0 and 1 can be determined if the current detection device 3 detects a current value within a predetermined time interval, and the detected current value is less than or greater than a certain current value.

With reference to FIG. 4 for a timing chart of a waveform of a current waveform signal of the present invention, the portion with a solid line represents the actual current waveform (Sinusoidal Wave), and the portion with a dotted line represents the actual data content (Logical Data) converted from the original current waveform. With the design of a first threshold value TH1, a second threshold value TH2 and a sampling time of 10 ms in this preferred embodiment, the current waveform is screened and sampled. If the current represented by the current waveform is greater than the first threshold value TH1 and the sampling time has reached 10 ms, then the current waveform is considered as a logical 1 signal. If the current represented by the current waveform is less than the second threshold value TH2 and the sampling time has reached 10 ms, then the current waveform is considered as a logical 0 signal. After the current waveform signal as shown in FIG. 4 is converted, the actual data signal of 10111 is obtained. The last upper-edge waveform in FIG. 4 is maintained for 5 ms only, thus the current waveform is not considered as a logical 1 signal.

Of course, persons ordinarily skilled in the art should understand that the technical measure used for screening and sampling the current waveform is not limited to the aforementioned method only, but any equivalent method for screening and sampling the current waveform can be used in the present invention and intended to be covered within the scope of the invention.

In summation of the description above, with the design of the present invention, the wireless apparatus operated in the testing mode not only receives electric power of a power supply source through a power cable, but also transmits current waveform signals directly through the power cable as testing signals for testing. Therefore, the wireless apparatus is no longer in need to reserve any testing points, to increase the area of the printed circuit board, to change any circuit layout or even to damage the appearance of the device, so as to save time at the mass production stage and improve the efficiency of the testing substantially. In addition, the present invention requires no power cable communication technology or additional hardware device to allow the power cable to transmit the testing signal, and thereby decreasing costs effectively.

The above-mentioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method for testing an electronic apparatus having a control unit to which a power supply voltage from a power supply source is applied, comprising:
    causing the control unit to switch between a working mode and a sleeping mode according to a predetermined instruction set indicative of an operation of a functional element of the electronic apparatus;
    detecting an alteration of a current waveform of a current corresponding to the power supply voltage prepared by the power supply source as a testing signal of the functional element of the electronic apparatus, wherein the alternation of the current waveform is caused by the control unit being switched between the working mode in which the control unit consumes the current generated from the power supply source, and the sleeping mode in which the control unit does not consume the current generated from the power supply source;
    defining the testing signal to be having a first logical state and a second logical state; and
    utilizing a current detection device for detecting whether a current value of the current is larger than a predetermined current threshold within a predetermined time interval in order to determine the first logical state or the second logical state.

2. The method for testing the electronic apparatus as recited in claim 1, wherein the power supply source has an anode and a cathode electrically coupled to a first power contact and a second power contact of the electronic apparatus, respectively.

3. The method for testing the electronic apparatus as recited in claim 1, wherein the functional element is a wireless communication module, a left button of a mouse, a right button of the mouse, or a press key.

4. A method for testing an electronic apparatus having a control unit to which a power supply voltage from a power supply source is applied, comprising:
    causing the control unit to switch between a working mode and a sleeping mode according to a predetermined instruction set indicative of an operation of a functional element of the electronic apparatus;
    detecting an alteration of a current waveform of a current corresponding to the power supply voltage prepared by the power supply source as a testing signal of the functional element of the electronic apparatus, wherein the alternation of the current waveform is caused by the control unit being switched between the working mode in which the control unit consumes the current generated from the power supply source, and the sleeping mode in which the control unit does not consume the current generated from the power supply source;
    defining the testing signal to be having a first logical state and a second logical state; and
    utilizing a current detection device for detecting whether a current value of the current is larger than a predetermined current threshold in order to determine the first logical state or the second logical state.

5. The method for testing the electronic apparatus as recited in claim 4, wherein the power supply source has an anode and a cathode electrically coupled to a first power contact and a second power contact of the electronic apparatus, respectively.

6. The method for testing the electronic apparatus as recited in claim 4, wherein the functional element is a wireless communication module, a left button of a mouse, a right button of the mouse, or a press key.

* * * * *